United States Patent [19]

Sagisaka et al.

[11] Patent Number: 4,908,933

[45] Date of Patent: Mar. 20, 1990

[54] METHOD OF MANUFACTURING A SUBSTRATE FOR MOUNTING ELECTRONIC COMPONENTS

[75] Inventors: Katsumi Sagisaka; Atsushi Hiroi; Mitsuhiro Kondo; Takeshi Takeyama, all of Oogaki, Japan

[73] Assignee: Ibiden Co., Ltd., Japan

[21] Appl. No.: 344,608

[22] Filed: Apr. 28, 1989

[30] Foreign Application Priority Data

May 12, 1988 [JP] Japan .................................. 63-115164

[51] Int. Cl.⁴ ............................................. H01R 43/00
[52] U.S. Cl. ..................................... 29/827; 156/629;
156/630; 156/652; 174/262
[58] Field of Search ...................... 156/629, 630, 652;
29/827, 846, 832; 174/68.5; 357/70; 361/421

[56] References Cited

U.S. PATENT DOCUMENTS 3,471,348 10/1969 Shaheen .......................... 174/68.5 X
4,052,787 10/1977 Shaheen .................................. 29/827

FOREIGN PATENT DOCUMENTS

52-48972 4/1977 Japan .
60-41249 3/1985 Japan .
60-194553 10/1985 Japan .

Primary Examiner—Carl J. Arbes
Attorney, Agent, or Firm—Leydig, Voit & Mayer

[57] ABSTRACT

A method of manufacturing a substrate for mounting electronic components according to this invention comprises the steps of forming a mask on a portion to be electrically connected to an exterior of a lead frame, of forming resin layers on both side surfaces of the lead frame by prepregs or the like, of removing the resin layer on the mask, and of removing the mask, and in the substrate for mounting electronic components manufactured according to this method, the substrate is integrally formed with the lead frame, and the electrical connection of the substrate to the lead frame is performed by through hole plating without using fine metal wiring.

1 Claim, 7 Drawing Sheets

METHOD OF MANUFACTURING A SUBSTRATE FOR MOUNTING ELECTRONIC COMPONENTS

BACKGROUND OF THE INVENTION

1. Field of the Invention

This invention relates to a method of manufacturing a substrate for mounting electronic components.

2. Description of the Prior Art

Figure 1:
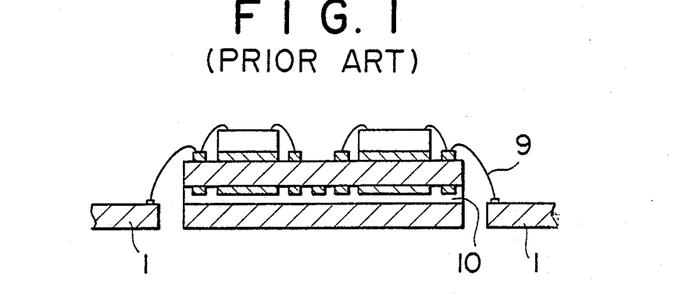
FIG. 1 is a sectional view showing an example of a conventional substrate for mounting electronic components.

A conventional example of a substrate for mounting electronic components which has a lead frame for electrically connecting the electronic component externally is shown in FIG. 1. An electronic component mounting section 10 of a conventional substrate for mounting electronic components shown in FIG. 1 is formed separately from a lead frame 1. In other words, the electronic component mounting section 10 is formed by preparing as a base material a glass epoxy copper-covered laminated board, a glass triazine copper-covered laminated board, glass polyimide copper-covered laminated board or the like, and forming it by a normal subtractive method through the steps of perforating, through-hole plating, etching, etc. The electronic component mounting section is bonded to the lead frame by a adhesive sheet or its equivalent, and the electronic component mounting section is electrically connected to the lead frame only by fine wiring 9 made of gold or the like having weak mechanical strength.

Since the electronic component mounting section is electrically connected to the lead frame only by fine metal wiring made of gold or the like in the prior art as described above, it has a very weak structure against external mechanical stress. In other words, the connecting reliability of the electronic component mounting section to the lead frame is very poor. Outer leads are formed entirely independently from the electronic component mounting section, and it is accordingly necessary to newly fix the outer leads by means of transfer molding or the like.

SUMMARY OF THE INVENTION

Accordingly, an object of the present invention is to solve the above-described problem occurring in the prior art and to hence provided a method of manufacturing a substrate for mounting electronic components by which its electronic component mounting section can be connected to a lead frame by a highly reliable connecting method without depending upon fine metal wiring and which does not always require a transfer molding.

In order to achieve this and other objects, the present invention employs the following means. A substrate having a conductor circuit necessary for mounting electronic components is integrally formed with a lead frame for electrically connecting the electronic components to the outside, the electrical connection depending not upon fine metal wiring but upon means using through holes, thereby allowing a most effective manufacturing method to be realized.

Other and further objects, features and advantages of the invention will appear more fully from the following description.

BRIEF DESCRIPTION OF THE DRAWINGS

FIGS. 3A to 10B are sectional views exemplifying various steps of a method of manufacturing according to the present invention.

DESCRIPTION OF THE PREFERRED EMBODIMENTS

The present invention will be described in detail with reference to embodiments shown in the accompanying drawings.

Figure 2A:
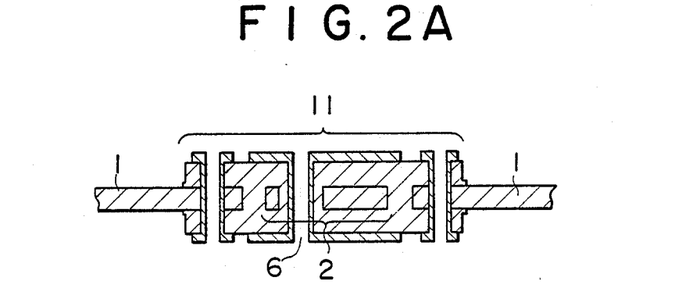
FIGS. 2A and 2B are sectional views showing representative examples of a substrate for mounting electronic components according to the present invention.
Figure 3A:
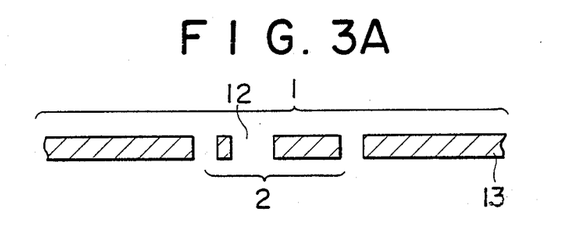

FIG. 2A is a sectional view of a substrate for mounting electronic components performed according to the method of the present invention. In FIG. 2A, reference numeral 1 denotes a lead frame, which is generally made of 42-alloy or copper but is not particularly limited as it may be made of any material that is adapted for its use or object. As shown in FIG. 3A, the lead frame 1 is processed as desired by etching, stamping, drilling or a combination thereof. More specifically, clearance for obtaining insulation of a through hole 6 necessary to form a conductor circuit on the substrate to the lead frame 1 is provided. In other words, a hole (hereinafter referred to as "primary hole 12") having a diameter larger than that of the through hole 6 is formed, and, if need be, the formation of islands 2 and holes necessary for conveying and positioning can be carried out. In this case, an outer lead 13 of the lead frame 1 is generally formed simultaneously, but the outer lead 13 may be formed after the step of exfoliating an outer lead mask to be described later.

Figure 4A:
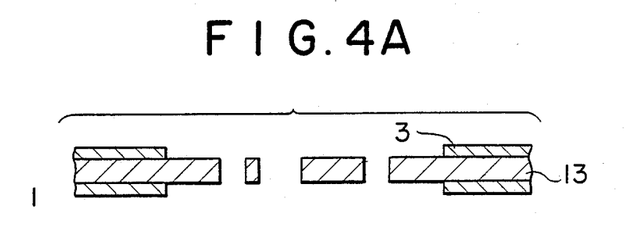

Then, as shown in FIG. 4A, a mask (hereinafter referred to as "outer lead mask 3", which is necessary on all portions of lead frame material to have their surfaces exposed when the substrate for mounting electronic components is completed) is formed on a portion to be electrically connected to at least an exterior of the lead frame 1. This step of forming the outer lead mask 3 is provided to prevent the outer lead 13 from directly contacting a prepreg, resin or both (hereinafter referred to as "prepreg 4") to bond the prepreg or the like onto the outer lead 13 in the next step of forming a resin layer.

Since said prepreg or the like is not only for bonding the lead frame 1 to a copper foil 5 through the prepreg 4, but also for filling up the primary hole 12 with resin, in the next step of forming a resin layer, a suitable flowability and quantity of resin is required. Accordingly, two or three sheets of 0.1 mm thick prepreg, for example, are employed, and the resin content of the prepreg is increased, or resin is further added in addition to the prepreg as required.

On the other hand, the outer lead mask 3 may be made of metals such as cooper, aluminum, stainless steel, etc., resins such as polyimide, fluorine, silicon, polyphenylene sulfide, polyether etherketon, etc. or composite materials thereof, and need not be limited thereto if the material chosen can attain the object of a mask at the temperature and pressure generated in the next step of forming the resin layer, i.e., if it can prevent the resin from bonding to the surface of the outer lead. Further, in the method of processing and forming the outer lead mask 3, the formation by employing mechanical working, such as etching, drilling, and further with photosensitive resin or any other method may be employed without limit.

Figure 5A:
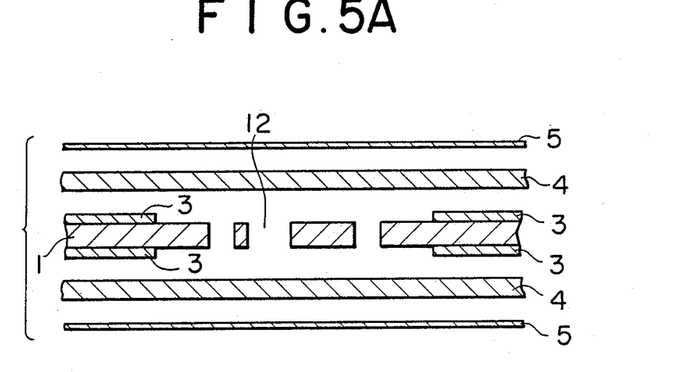
Figure 6A:
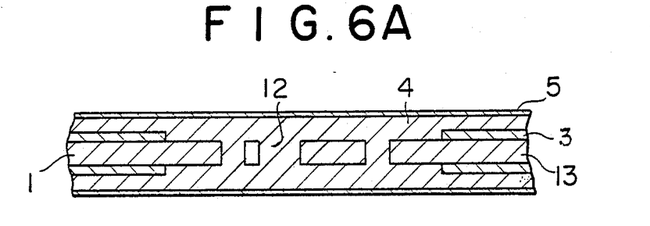
Figure 7A:
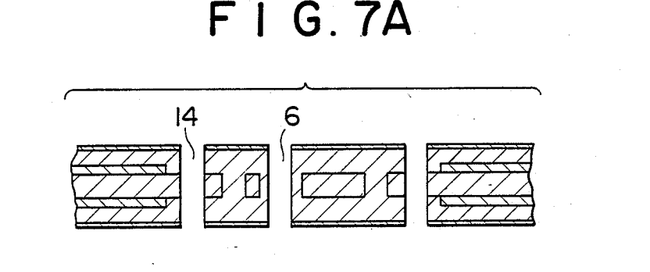
Figure 8A:
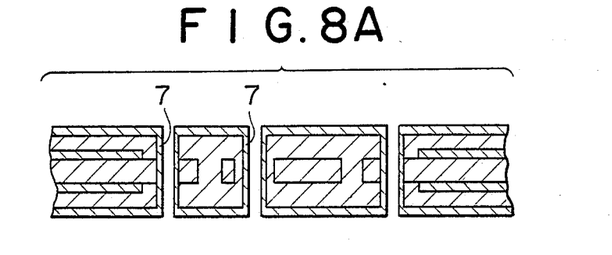
Figure 9A:
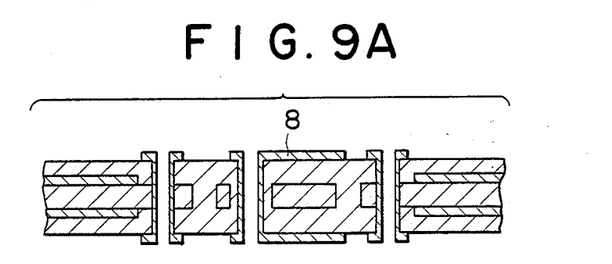

Next, prepregs 4 and, as required, copper foils 5 are disposed on both side surfaces of the lead frame 1 under the conditions determined by the pressure, temperature and time and the like adapted for curing the prepreg 4 used and filling up the primary hole 12 (FIG. 5A), the formation of a resin layer being carried out after alignment (FIG. 6A). Thereafter, holes are opened by a normal subtractive method (through hole 6 for forming a conductor circuit on the substrate, through hole 14 for electrically connecting the electronic components to the lead frame, and any holes necessary to position other components) (FIG. 7A), through hole plating 7 (FIG. 8A) is performed, and, as required, etching (FIG. 9A), Ni-Au plating, solder resist, solder-coating, etc. are further carried out.

Figure 10A:
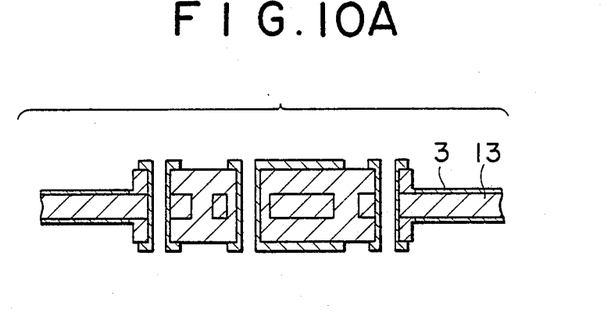

Then, in order to remove the outer lead mask 3, the prepregs 4 and the like are removed. In order to surely perform the removal, it is preferable to remove the prepreg 4 disposed on the outer lead 13 from an area slightly larger than that of the outer lead mask 3 as shown in FIG. 10A. The method used here may include mechanical working, etching, a combination thereof or the like, and is not thereto if the means chosen reliably removes them. In this case, it is preferable to completely remove the prepreg and the like on the outer lead mask. Accordingly, the depth accuracy when the step of removing the resin layer on the outer lead mask, for example by mechanical working is very important. This is because it must be performed without damaging the surface of the outer lead and the prepreg and the like must be almost totally removed.

After this, the outer lead mask is removed to complete a substrate for mounting electronic components according to the method of the present invention as shown in FIG. 2A.

As the electrical connection between electronic component mounting section and the lead frame is achieved by the through hole plating according to the means described above in the method according to the present invention, connecting reliability is greatly improved.

Thereafter, electronic components are placed and connected on the substrate for mounting electronic components according to the present invention, and since the outer leads are secured by the prepreg or the like, potting may be used as a sealing configuration, or a transfer molding may also be employed.

EMBODIMENTS

This invention will be described in detail in accordance with the embodiments shown in the drawings.

Embodiment 1

FIG. 3A is a sectional view of a lead frame 1 formed with holes and in a shape, such as primary hole 12 and outer lead 13, etc. necessary to form a substrate for mounting electronic components according to the present invention. Film-type photosensitive resins having a 150 μm thickness were laminated on both side surfaces of the lead frame 1, exposed, developed, and an outer lead mask 3 was formed on a portion to be desirably exposed at the lead frame material on its surface, such as an outer lead 13, when a substrate for mounting electronic components was completed, as shown in FIG. 4A.

Then, two sheets of glass triazine prepreg 4 each having a 0.1 mm of thickness were laminated, copper foils 5 each having a 18 μm thickness were disposed on both side surfaces of the lead frame 1 as shown in FIG. 5A, and thermally pressurized under the conditions of 180° C., 40 kgf/cm² and 90 min. (FIG. 6A). Thereafter, a substrate (FIG. 9A) was formed through the various steps of opening through holes 6, 14, etc. (FIG. 7A), through hole plating 7 (FIG. 8A), and pattern formation, such as etching, and the like, by a normal subtractive method.

Subsequently, copper foils 5 and the prepregs 4 of the portions except the islands and the inner leads were removed by end milling [zaguri working]as shown in FIG. 10A. In this case, sufficient attention was paid to the end milling depth so as not to damage the outer lead 13 with the end milling cutting tool and to remove substantially all the prepreg.

Thereafter, the outer lead mask 3 made of the photosensitive resin was removed, and a substrate for mounting electronic components according to the present invention was completed as shown in FIG. 2A.

Embodiment 2

Figure 5B:
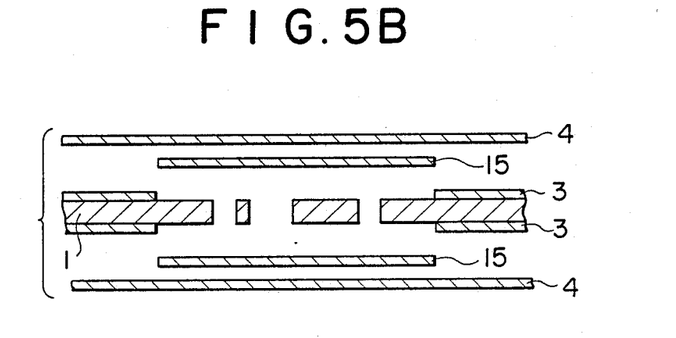

Outer lead masks 3 made of aluminum each having a 200 μm thickness and a through hole formed in advance by mechanical working only at a position corresponding to a substrate portion for forming a conductor circuit necessary for mounting electronic components were disposed as shown in FIG. 4A on both side surfaces of a lead frame 1 shown in FIG. 3A. Then, as shown in FIG. 5B, black G-10 prepregs 15 made of heat resisting glass epoxy cut separately in the size of the substrate portion were disposed on both sides of the portion of the through hole of the outer lead mask, the black G-10 prepregs 4 were similarly disposed on the whole surfaces of both sides, and thermally pressurized under the conditions of 145° C., 10 kgf/cm², 35 min., and further at 170° C., 25 kgf/cm², for 100 min.

Then, after the steps including normal hole opening, through hole plating and pattern forming by additive method were conducted, end milling [zagri working]was performed similarly to the Embodiment 1 as shown in FIG. 10A, the outer lead mask 3 was removed, and a substrate for mounting electronic components according to the present invention was completed as shown in FIG. 2A.

Embodiment 3

Figure 5C:
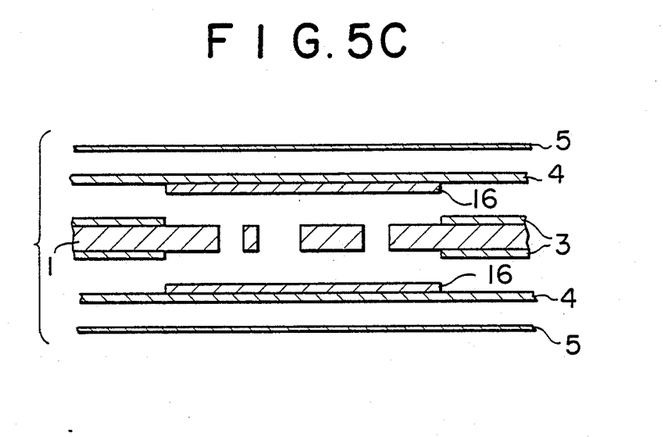

A thermosetting solvent exfoliation type resin was screen printed only on portions of the surface of the lead frame material desired to be exposed when the substrate for mounting electronic components was completed, on both side surfaces of a lead frame 1 shown in FIG. 3A, and thermally set to form an outer lead mask 3 as shown in FIG. 4A. Then, prepregs 4 made of glass triazine (0.1 mm thick) in which a hole filling resin 16 (epoxy) for filling up a primary hole, etc. was printed to have a height of 150 to 300 μm on the portions corresponding to the substrate having a conductor circuit necessary for mounting electronic components and copper foils 5 (18 μm thick) were disposed as shown in FIG. 5C, and thermally pressurized for 90 min. under the conditions of 180° C. and 40 kgf/cm² (FIG. 6A).

Then, after the steps including hole opening (FIG. 7A), through hole plating (FIG. 8A), and pattern forming (FIG. 9A), by a normal subtractive method were conducted, end milling [zagri working]was performed similarly to the Embodiments 1 and 2 as shown in FIG. 10A, the outer lead mask 3 was removed, and a substrate for mounting electronic components according to the present invention was completed as shown in FIG. 2A.

Embodiment 4

Figure 3B:
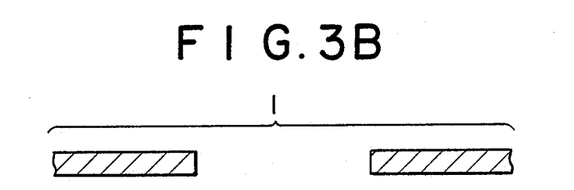
Figure 4B:
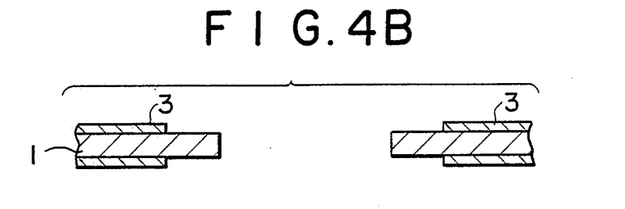
Figure 5D:
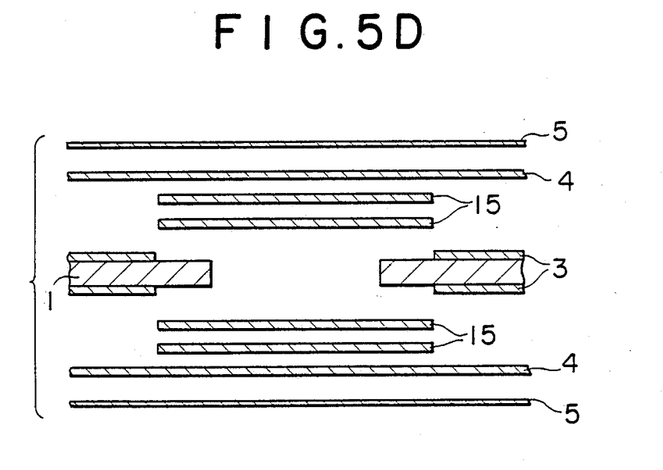
Figure 6B:
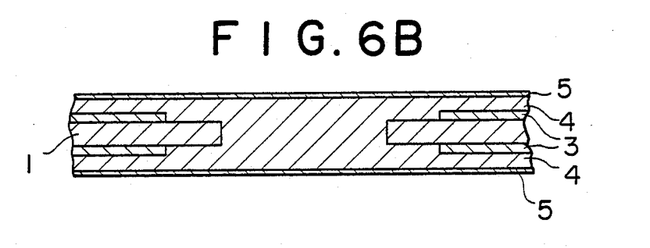

Outer lead masks 3 made of polyimide resin each having a through hole formed in advance by mechanical working only at a portion corresponding to a substrate having a conductor circuit necessary for mounting electronic components were disposed as shown in FIG. 4B on both sides of a lead frame 1 shown in FIG. 3B. Then two 0.1 mm thick prepregs 15 made of glass triazine cut separately in the size of the substrate portion were disposed at said through hole portions, 0.1 mm thick prepregs 4 of glass triazine and 18 m thick copper foils 5 were further disposed to cover the whole surfaces of both sides (FIG. 5D), and thermally pressurized for 90 min. at 180° C., and 40 kgf/cm$^2$ (FIG. 6B).

Figure 7B:
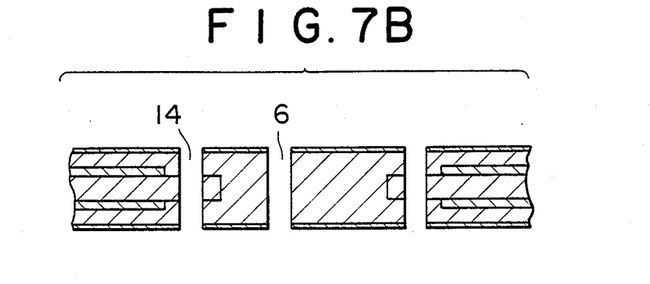
Figure 8B:
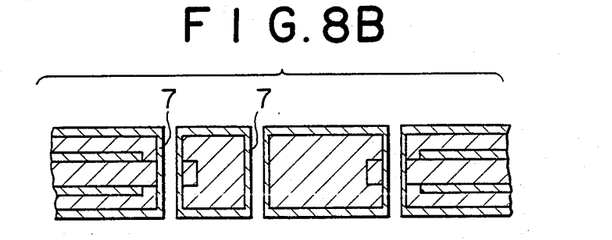
Figure 9B:
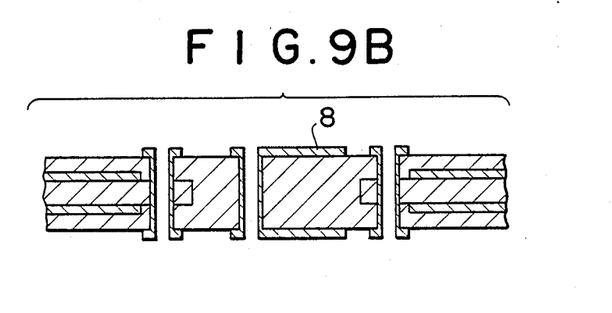

Then, the steps including the steps of opening through holes 6, 14, etc. (FIG. 7B), through hole plating 7 (FIG. 8B), and pattern forming, by a normal subtractive method were conducted, and to form a substrate in FIG. 9B.

Figure 10B:
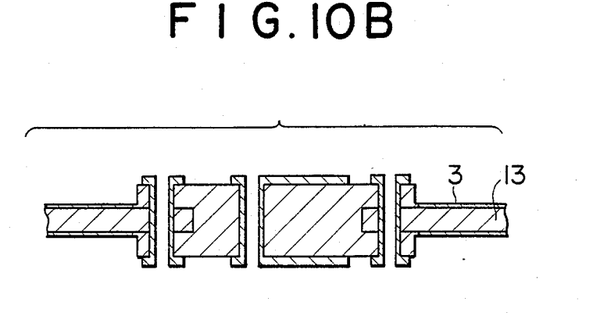

Subsequently, copper foils 5 and the prepregs 4 of the portions except the islands and the inner leads were removed by end milling [zagri working]as shown in FIG. 10B. In this case, sufficient attention was paid to the end milling depth so as not to damage the outer lead 13 with the end milling cutting tool and to remove substantially all the prepreg.

Figure 2B:
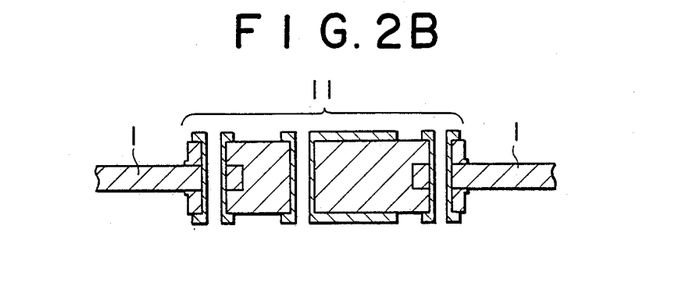

Thereafter, the outer lead mask 3 made of the photosensitive resin was removed, and a substrate for mounting electronic components according to the present invention was completed as shown in FIG. 2B.

Since the electric component mounting section is electrically connected to the lead frame by the through hole plating by using the method of manufacturing according to the present invention as described above, connecting reliability can be remarkably improved. Further, since the outer lead is secured by the printed circuit substrate or the like, potting can be used as a sealing configuration, the types of prepregs that can be used are increased, and since the electrical connection is completed without using adhesive sheet which does not satisfy migration resistance and bondability at present, the reliability of the electrical connection is remarkably improved. In other words, according to the method of manufacturing the substrate for mounting electronic components in accordance with the present invention, the electrical connection of the electronic components to the lead frame is at least obtained by the through hole plating. Therefore, a substrate for mounting electronic components in which connecting reliability is remarkably improved can be easily and reliably manufactured.

What is claimed is:

1. A method of manufacturing a substrate for mounting electronic components comprising a substrate having a conductor circuit necessary to mount the electronic components, and a lead frame for electrically connecting the electronic components to the exterior, said substrate being integrally formed with said lead frame, the electrical connection of said electronic component to said lead frame being at least performed by a through hole plating, the method comprising the steps of:

(1) forming a mask on a portion to be electrically connected to an exterior of said lead frame;
(2) forming resin layers on both side surfaces of said lead frame by a prepreg;
(3) removing the resin layer on said mask; and
(4) removing said mask.

* * * * *